(12) United States Patent
Matsubara et al.

(10) Patent No.: US 10,985,290 B2
(45) Date of Patent: Apr. 20, 2021

(54) PHOTODETECTOR AND OPTICAL DISTANCE MEASURING DEVICE

(71) Applicant: KABUSHIKI KAISHA TOYOTA CHUO KENKYUSHO, Nagakute (JP)

(72) Inventors: Hiroyuki Matsubara, Nagakute (JP); Isamu Takai, Nagakute (JP); Seigo Ito, Nagakute (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 0 days.

(21) Appl. No.: 16/273,419

(22) Filed: Feb. 12, 2019

(65) Prior Publication Data

US 2019/0259899 A1 Aug. 22, 2019

(30) Foreign Application Priority Data

Feb. 22, 2018 (JP) .............................. JP2018-029548

(51) Int. Cl.
| | | |
|---|---|---|
| *H01L 31/107* | (2006.01) | |
| *G01S 7/4861* | (2020.01) | |
| *G01S 7/4863* | (2020.01) | |
| *G01S 7/4865* | (2020.01) | |
| *G01S 17/10* | (2020.01) | |

(52) U.S. Cl.
CPC .......... *H01L 31/107* (2013.01); *G01S 7/4861* (2013.01); *G01S 7/4863* (2013.01); *G01S 7/4865* (2013.01); *G01S 17/10* (2013.01)

(58) Field of Classification Search
CPC .... G01S 7/4861; G01S 7/4863; G01S 7/4865; G01S 17/10; H01L 31/107
USPC ........................ 365/5.01; 250/208.1; 257/438
See application file for complete search history.

(56) References Cited

U.S. PATENT DOCUMENTS

| | | | |
|---|---|---|---|
| 2009/0121306 A1 | 5/2009 | Ishikawa | |
| 2011/0042573 A1* | 2/2011 | Kim | G01T 1/17 250/370.01 |
| 2014/0191114 A1* | 7/2014 | Russo | G01J 1/44 250/208.2 |
| 2016/0003937 A1* | 1/2016 | Metz | G01S 7/48 356/5.01 |

(Continued)

FOREIGN PATENT DOCUMENTS

| | | |
|---|---|---|
| JP | 2006-179828 A | 7/2006 |
| JP | 2012-060012 A | 3/2012 |

OTHER PUBLICATIONS

Buzhan et al., Silicon Photomultiplier and its Possible Applications, Nuclear Instruments and Methods in Physics Research, pp. 48-52. 2003.

(Continued)

*Primary Examiner* — Mohammed Shamsuzzaman
*Assistant Examiner* — Aaron J Gray
(74) *Attorney, Agent, or Firm* — Oliff PLC

(57) ABSTRACT

A photodetector includes a light receiving part having a plurality of light receiving elements, and a signal processing part that adds outputs from the light receiving elements and outputs the result. A plurality of measurements are performed while combination of effective light receiving elements among the light receiving elements in the light receiving part is changed. The results of the measurements are subjected to a compressive sensing process to determine an output signal of for each light receiving element or for each group of light receiving elements.

11 Claims, 14 Drawing Sheets

(56) References Cited

U.S. PATENT DOCUMENTS

2017/0242102 A1    8/2017   Dussan et al.
2017/0242108 A1*   8/2017   Dussan ................... G01S 7/487
2018/0081040 A1*   3/2018   Kubota ................. G01S 7/4865

OTHER PUBLICATIONS

Feb. 2, 2021 Office Action issued in Japanese Patent Application No. 2018-029548.

* cited by examiner

FIRST PATTERN

SECOND PATTERN

PATTERN A

PATTERN B

PHOTODETECTOR AND OPTICAL DISTANCE MEASURING DEVICE

CROSS REFERENCE TO RELATED APPLICATION

The entire disclosure of Japanese Patent Application No. 2018-029548 filed on Feb. 22, 2018 including the specification, claims, drawings, and abstract is incorporated herein by reference in its entirety.

TECHNICAL FIELD

The present disclosure relates to a photodetector, in particular, to a photodetector utilizing therewith an avalanche effect and an optical distance measuring device.

BACKGROUND

An avalanche photodiode (APD) may be used in optical communication, optical radar, or other applications, as a light receiving element for detecting a weak light signal. When photons enter the APD, electron-hole pairs are generated, and the electrons and the positive holes are each accelerated by a high electric field and consecutively cause avalanche impact ionization one after another, thereby generating new electron-hole pairs.

The APD operates in a linear mode when a reverse bias voltage less than a breakdown voltage is applied, and the APD operates in a Geiger mode when a reverse bias voltage equal to or greater than the breakdown voltage is applied. In the linear mode, a rate of annihilated electron-hole pairs that go out from the high electric field is greater than a rate of generated electron-hole pairs, and thus, the avalanche naturally ceases. An output current is approximately proportional to a quantity of incident light and thereby can be used to measure the quantity of the incident light. In the Geiger mode, even the incidence of a single photon can cause an avalanche phenomenon. Such a photodiode is called a single photon avalanche diode (SPAD). The avalanche is stopped by lowering an applied voltage to a breakdown voltage in the SPAD. This method for stopping the avalanche phenomenon by lowering the applied voltage is called "quenching." The simplest quenching circuit is achieved by connecting a quenching resistor to an APD in series. When an avalanche current is generated, a voltage between terminals of the quenching resistor increases, and a bias voltage of the APD drops. When the bias voltage drops to less than the breakdown voltage, the avalanche current stops. It is possible to apply a high electric field to the APD, and thus, the APD is capable of responding to weak light at high speed, thereby is widely used in optical distance measuring devices and in fields such as optical communication.

An optical distance measuring device performs a time-of-flight (TOF) measurement using an APD and has a measurement accuracy on the order of nanoseconds and low power consumption. For these reasons, the optical distance measuring device can be used in apparatuses such as a collision avoidance safety apparatus that measures a distance to an obstacle or a person on a road. The optical distance measuring device for such purposes needs to satisfy desired requirements for response speed, noise immunity, sensitivity, power consumption, dimensions, and cost. A complementary metal-oxide-semiconductor (CMOS) technique is publicly known as a technique that satisfies some of these requirements. The CMOS technique may be used in the APD, and this APD is known as a silicon photo multiplier (SiPM). The SiPM is used by arranging a plurality of APDs in a matrix with an array shape so as to have a micro-pixel (MP) structure that collectively uses the plurality of the APDs as one pixel. This structure suppresses signal saturation due to background light and improves a signal-to-noise (S/N) ratio.

Meanwhile, the MP structure that includes the plurality of the APDs as a set decreases spatial resolution of signals due to the use of the plurality of the pixels as one pixel.

SUMMARY

An aspect of the present disclosure provides a photodetector including: an array having a plurality of light receiving elements; and an adding circuit that adds outputs from the light receiving elements and outputs the result, the photodetector being configured to cause the adding circuit to output a plurality of measurement results while changing combination of effective light receiving elements among the light receiving elements in the array and to subject the plurality of measurement results to a compressive sensing process to determine an output signal for each light receiving element or for each group of light receiving elements.

The light receiving elements may include avalanche photodiodes that are used in a Geiger mode. The photodetector may further include a plurality of discriminating circuits that convert output signals from the avalanche photodiodes into rectangular pulses. The adding circuit may add the rectangular pulses, which are generated by the plurality of discriminating circuits, and may output the result.

The output from the adding circuit may be subjected to a threshold process.

Output signals may be obtained from the light receiving elements while on and off states of the light receiving elements in the array are switched on a time basis, and the output signals may be subjected to the compressive sensing process.

The on and off states of the light receiving elements may be randomly switched. The on and off states of the light receiving elements may be switched on a time basis while the ratio between the number of on-state light receiving elements and the number of off-state light receiving elements is kept constant.

Output signals may be obtained from the light receiving elements while some of the light receiving elements in the array are switched and selected on a time basis, and the output signals may be subjected to the compressive sensing process.

The light receiving elements may be randomly selected.

Output signals obtained from some of the light receiving elements in the array and output signals obtained from some of the remaining light receiving elements may be subjected to the compressive sensing process at the same time.

The ratio between the number of on-state light receiving elements and the number of off-state light receiving elements may be set in accordance with the number of measurements.

A faulty element among the light receiving elements may be determined by the compressive sensing process.

The ratio between the number of on-state light receiving elements and the number of off-state light receiving elements may be set in accordance with the intensity of background light.

Another aspect of the disclosure provides an optical distance measuring device including any one of the photodetectors described above and configured to perform distance measurement by measuring the time taken for applied light to travel.

BRIEF DESCRIPTION OF DRAWINGS

Embodiment(s) of the present disclosure will be described by reference to the following figures, wherein.

DESCRIPTION OF EMBODIMENTS

First Embodiment

Figure 1:
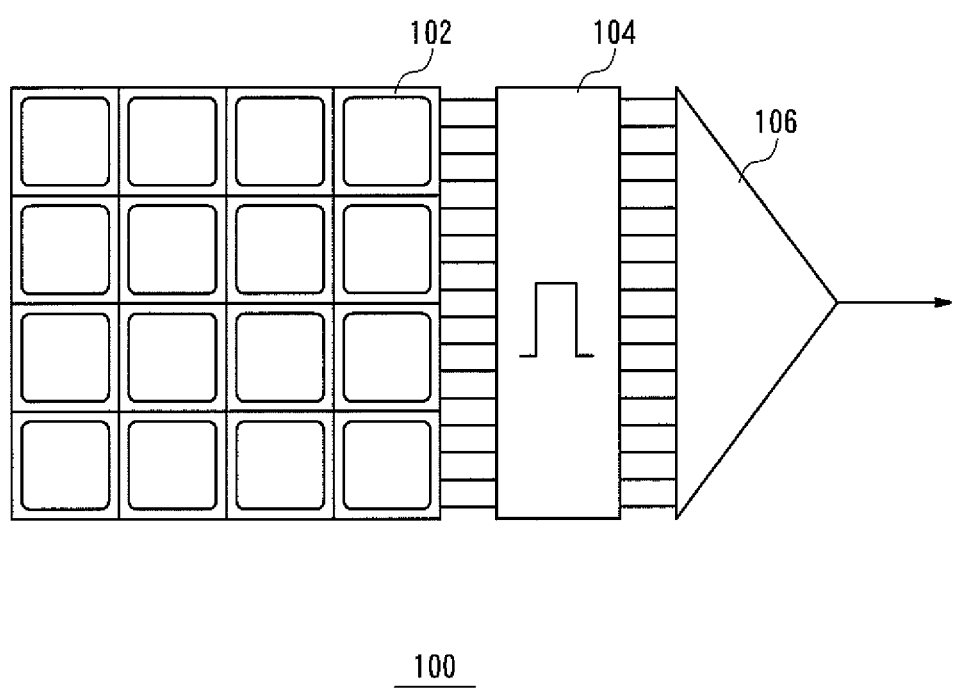
FIG. 1 shows a structure of a photodetector according to a first embodiment.
Figure 2:
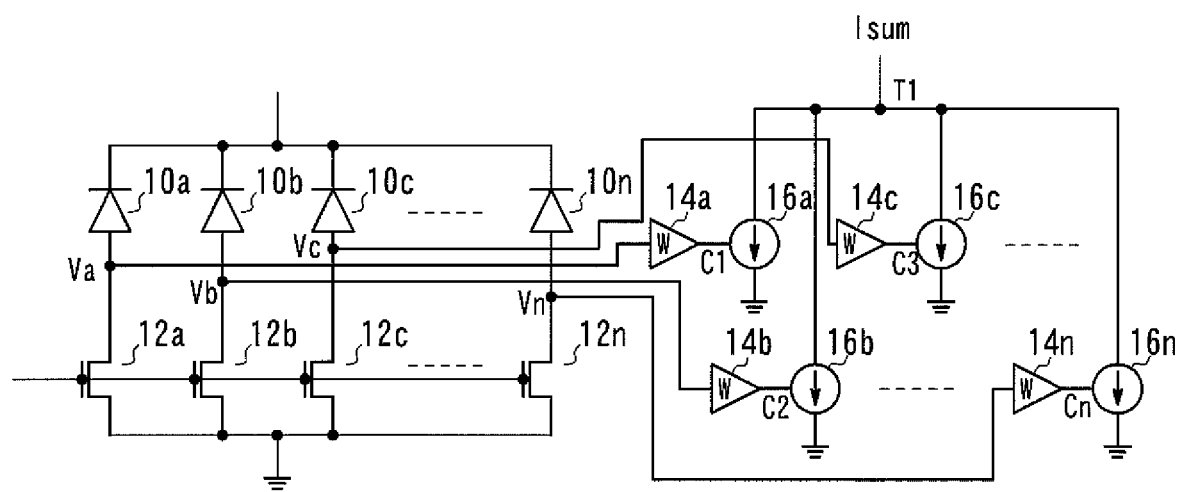
FIG. 2 shows an example of the structure of the photodetector according to the first embodiment.

The first embodiment uses a photodetector 100 that includes a light receiving part 102, a discriminating part 104, and a signal processing part 106, as shown in FIG. 1. FIG. 2 shows a specific example of the structure of the photodetector 100.

The light receiving element 102 includes a silicon photo multiplier (SiPM) 10 (single photon avalanche photodiodes 10a to 10n) as light receiving elements and quenching elements 12 (12a to 12n). The discriminating part 104 includes discriminating circuits 14 (14a to 14n). The signal processing part 106 includes current sources 16 (16a to 16n).

FIG. 1 shows a case in which the number n of pixels is 16. Of course, the applicable scope of the disclosure is not limited to 16 pixels.

The following describes a state as an active state when each signal is at a high level and describes the state as an inactive state when each signal is at a low level. However, similar operations and effects can be obtained also in a case of structuring a circuit so that the state will be an active state when each signal is at a low level and will be an inactive state when each signal is at a high level.

The light receiving part 102 includes an array of single photon avalanche photodiodes (SPADs) 10a to 10n. The SiPM 10 includes SPADs 10a to 10n. Each of the SPADs 10a to 10n operates in a Geiger mode. That is, each of the SPADs 10a to 10n is operated by using a reverse bias voltage that is equal to or greater than a breakdown voltage and functions as a photon counting light receiving element that causes an avalanche phenomenon in response to incidence of even a single photon. Thus, the SiPM 10 has a high sensitivity relative to incident light such as laser light.

An area of a guard ring or a metal wiring of each of the SPADs 10a to 10n may be decreased as much as possible so as to increase a fill factor, which is a ratio of a light receiving area to an element area. In particular, the fill factor is increased by not forming a quenching element or a recharging element in the array of the SPADs that are arranged in the matrix.

The quenching elements 12 (12a to 12n) may be made of transistors. The quenching elements 12 (12a to 12n) may be connected to the SPADs 10a to 10n by wiring, outside the array of the SPADs 10a to 10n.

When an avalanche current is generated in each of the SPADs 10a to 10n, a voltage between terminals of each of the quenching elements 12 increases, and a bias voltage for each of the SPADs 10a to 10n drops. When the bias voltage drops to less than the breakdown voltage, the avalanche current stops. The quenching elements 12 (12a to 12n) are connected to the respective SPADs 10a to 10n in series and are also used to generate output voltages for the respective discriminating circuits 14 (14a to 14n).

The quenching elements 12 are turned on and off to switch on states and off states of the respective SPADs 10a to 10n of the SiPM 10. The SPADs 10a to 10n output signals in the on states and does not output signals in the off states when receiving light.

The discriminating circuits 14 (14a to 14n) are respectively provided to the pairs of the SPADs 10a to 10n and the corresponding quenching elements 12a to 12n. The following describes the discriminating circuit 14a as an example, but the same description applies to the discriminating circuits 14b to 14n.

Figure 3:
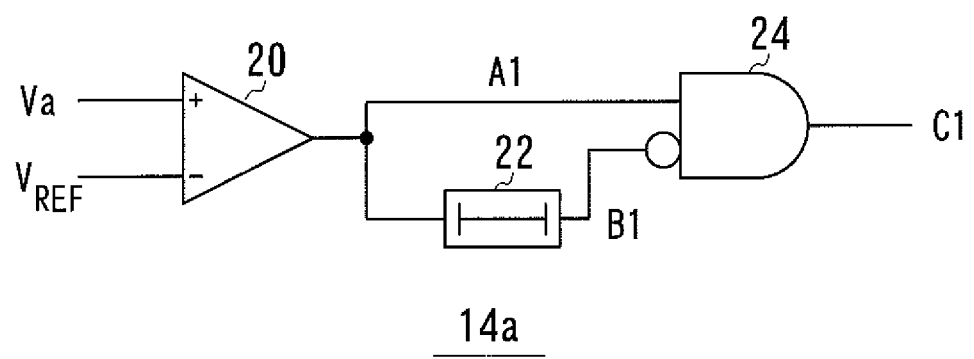
FIG. 3 shows a structure of a discriminating circuit according to the first embodiment.
Figure 4:
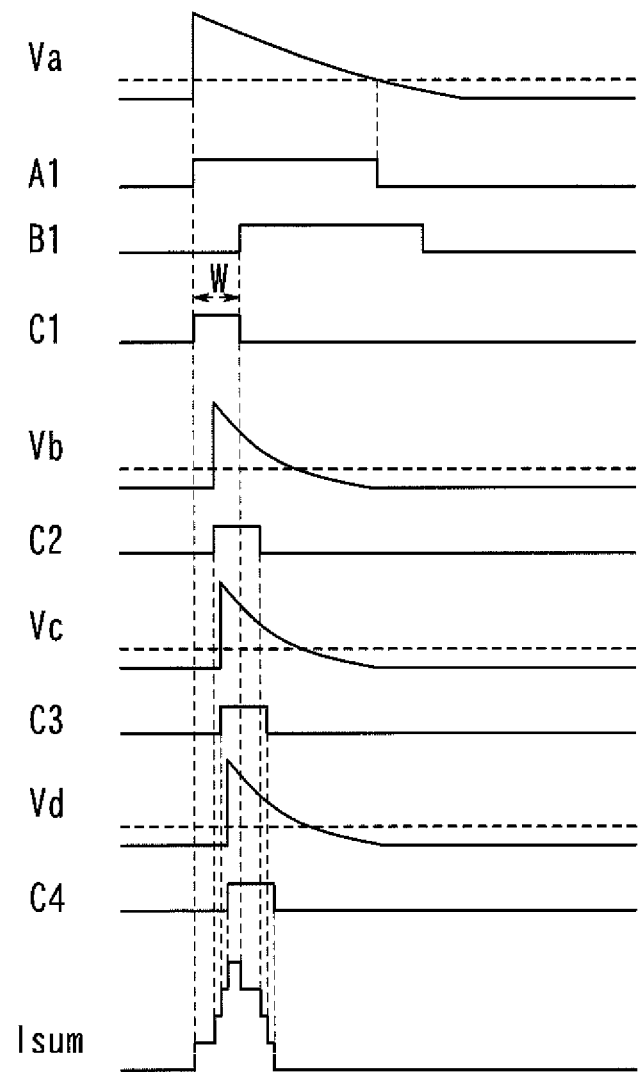
FIG. 4 is timing charts showing operation of the photodetector according to the first embodiment.

The discriminating circuit 14a compares a terminal voltage of the quenching element 12a with a predetermined reference value and generates a rectangular pulse in accordance with the result of the comparison. The discriminating circuit 14a includes a comparator 20, a delay element 22, and an AND element 24, as shown in FIG. 3. FIG. 4 shows timing charts for explaining operations of the discriminating circuits 14a to 14n.

The comparator 20 receives a terminal voltage Va of the quenching element 12a and compares the terminal voltage Va with a reference voltage $V_{REF}$. The comparator 20 outputs an output pulse A1 at a high level when the terminal voltage Va is equal to or greater than the reference voltage $V_{REF}$, or outputs an output pulse A1 at a low level when the terminal voltage Va is less than the reference voltage $V_{REF}$. The delay element 22 receives the output pulse A1 from the comparator 20 and delays this pulse by a delay time W, and the delay element 22 outputs the resultant pulse as an output pulse B1. The delay time W may be shorter than a dead time of the SPAD 10a; that is, a time from a rise of the terminal voltage Va that is an output of the SPAD 10a until disappearance of the terminal voltage Va. Specifically, the delay time W may be 1 nanosecond or greater and 20 nanoseconds or smaller. The AND element 24 receives the output pulse A1 from the comparator 20 and an inverted signal of the output pulse B1 from the delay element 22, and the AND element 24 calculates and outputs the logical product thereof. Thus, the discriminating circuit 14a generates and outputs a rectangular pulse C1 with a pulse width having the predetermined delay time W from a time point when the terminal voltage Va output from the SPAD 10a becomes equal to or greater than the reference voltage $V_{REF}$.

The terminal voltage Va, which is output from the SPAD 10a, quickly rises when the SPAD 10a receives a photon, and therefore, the rectangular pulse C1 is a signal that rises at approximately the same time as the time when the SPAD 10a receives the photon. As shown in FIG. 4, the discriminating circuits 14b to 14n also function in the same manner as in the discriminating circuit 14a.

The current sources 16 (16a to 16n) receive the rectangular pulses C1 to Cn from the discriminating circuits 14 (14a to 14n) and supply current of predetermined values while each of the rectangular pulses C1 to Cn is at a high level. The current sources 16 (16a to 16n) are connected to one output terminal T1. As shown in FIG. 2, the currents that are output from the respective current sources 16 (16a to 16n) are summed, and the summed current Isum flows to the output terminal T1. That is, the current sources 16 constitute an adding circuit.

As shown in FIG. 4, the summed current Isum has a value corresponding to a total number of photons detected at approximately the same time at the SPADs 10a to 10n of the SiPM 10. Thus, the summed current Isum may be used as a trigger signal to increase accuracy of detecting laser light that is reflected back from an object to be measured. For example, this embodiment may be structured so that a trigger signal will be output when photons enter three or more of the SPADs 10a to 10n, and the summed current Isum shows three or more units accordingly. In this case, an effect of steady noise is reduced, whereby pulsed light is detected at a high accuracy.

Figure 5:
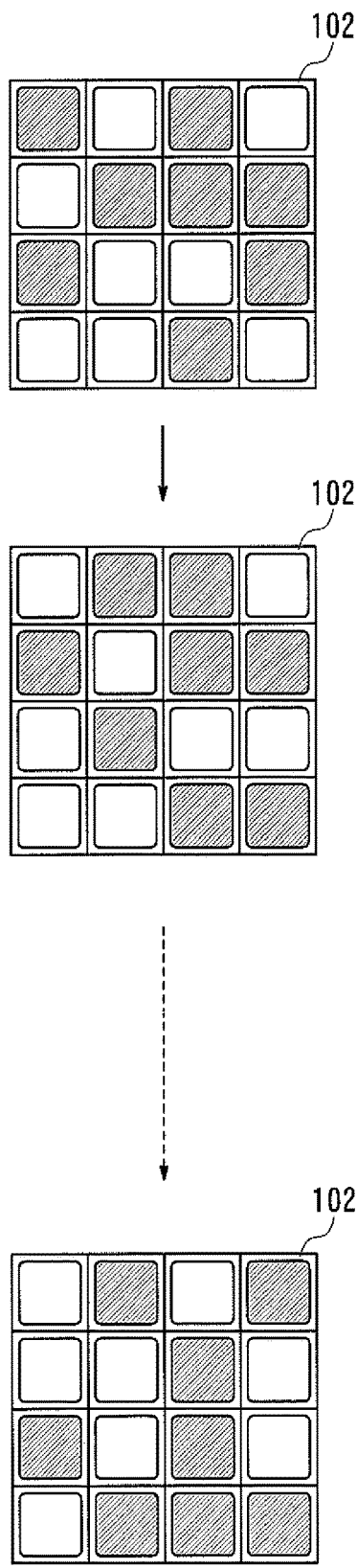
FIG. 5 shows an example of on states and off states of single photon avalanche photodiodes in the first embodiment.
Figure 6:
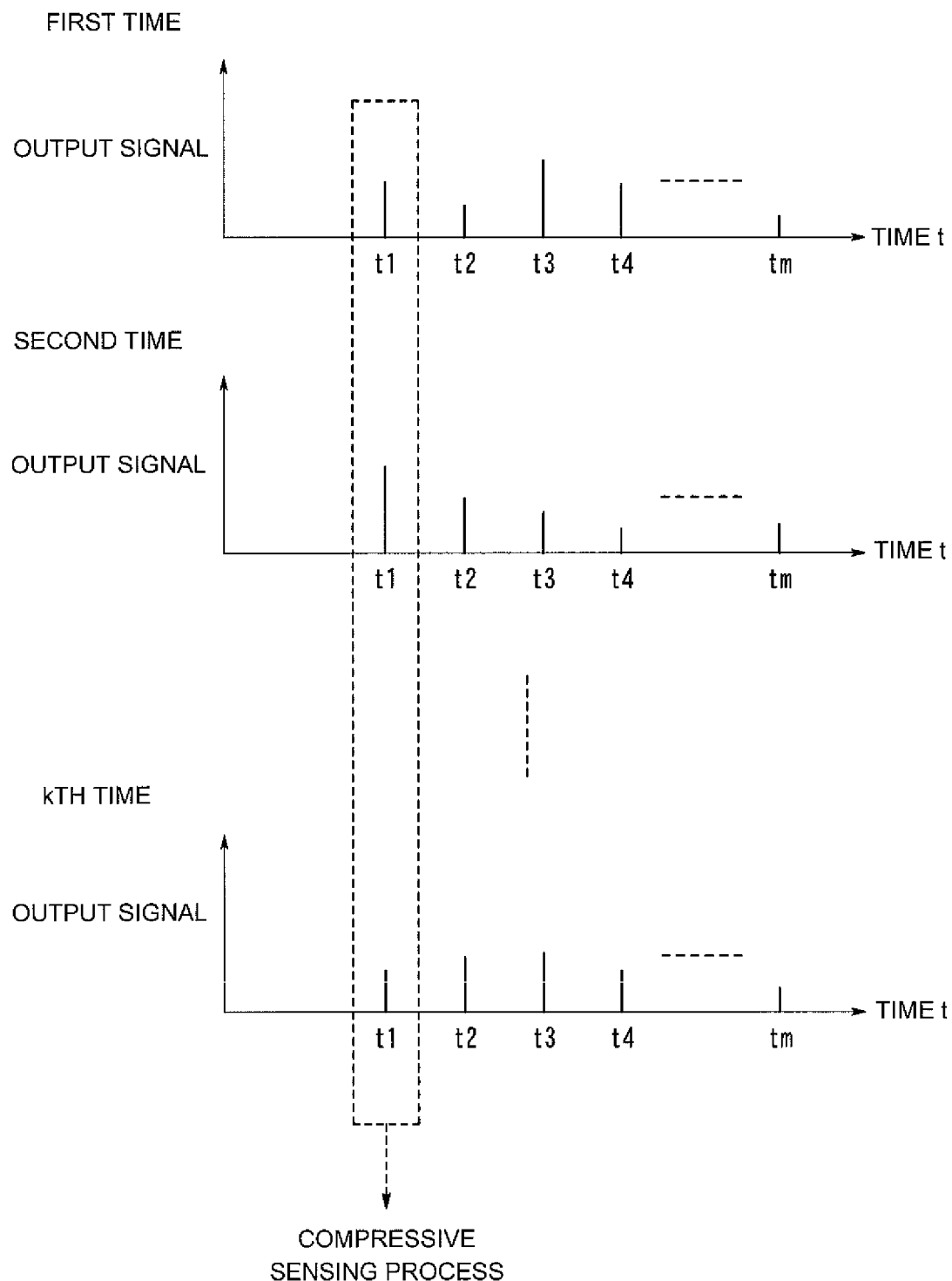
FIG. 6 shows examples of results of measurements in the first embodiment.

In this embodiment, a plurality of measurements are performed by switching the on state and the off state of each element of the SPADs 10a to 10n of the SiPM 10, and output of each of the elements is calculated from output signals obtained by the plurality of the measurements. For example, as shown in FIG. 5, pulsed light is emitted to a target space, and one measurement is performed by randomly switching the on state and the off state of each of the elements so that 50% of the elements of the SPADs 10a to 10n will be in the on state at times t1, t2, . . . , and tm, after a predetermined time has passed from time t0 when the pulsed light is emitted. In FIG. 5, a SPAD with hatching is in the on state, whereas a SPAD with no hatching is in the off state. This measurement is repeated k times, whereby results of the measurements as shown in FIG. 6 are obtained.

In these measurements, k signals are obtained at the same measurement times. The k signals are subjected to compressive sensing to determine which of the elements of the SPADs 10a to 10n reacts. For example, in the measurement repeated k times, signals output at time t1 may be subjected to compressive sensing, so that it is determined which of the elements of the SPADs 10a to 10n reacts a greater number of times at time t1 and which of the elements of the SPADs 10a to 10n reacts a smaller number of times at time t1.

The compressive sensing can use an existing technique. For example, a method disclosed in U.S. patent application Ser. No. 11/379,688 may be employed.

The processing described above increases spatial resolution of the photodetector 100. In particular, in sensing using the photodetector 100, the number of the SPADs that react at each measurement time is very small. That is, a sparse property of a signal is high, and the effect of compressive sampling is very high. This enables obtaining a high resolution with a small number of measurement times. Specifically, the output of each of the SPADs 10a to 10n is determined while the scale of the circuit is maintained small. In addition, it is possible to extract a failed element and a malfunctioning element on the basis of the output from each of the SPADs 10a to 10n. For example, among the SPADs 10a to 10n, an element that outputs a value less than a predetermined threshold may be determined as having a failure or a malfunction.

The spatial resolution is improved by the least number of measurement times in the condition in which a half of the SPADs 10a to 10n are set to be in the on state, and the remaining half is set to be in the off state. However, the ratio of the elements in the on state and the elements in the off state may be changed in accordance with a signal-to-noise (S/N) ratio or an intensity of background light.

For example, increasing the ratio of the elements in the on state among the SPADs 10a to 10n decreases reduction in the signal-to-noise (S/N) ratio. Specifically, the ratio of the SPADs that are set to be in the on state is increased in a case in which a ratio of the number of the measurements is high relative to the number of the light receiving elements.

On the other hand, for example, decreasing the ratio of the elements in the on state among the SPADs 10a to 10n prevents saturation of output signals due to background light. Specifically, the ratio is controlled depending on change in the background light. That is, the ratio of the SPADs that are set to be in the on state is decreased when the intensity of the background light is increased, whereas the ratio of the SPADs that are set to be in the on state is increased when the intensity of the background light is decreased. The background light may be measured by a photosensitive sensor additionally provided to the photodetector 100 or by another device, or may be measured on the basis of the intensity of an output signal from the SiPM 10 in the condition of not outputting a pulse signal.

Although the SPAD to be set in the on state or the off state is randomly selected in this embodiment, the SPAD may be selected in accordance with a predetermined pattern. The pattern may be determined so as to have a predetermined regularity or may be determined on the basis of an incidence pattern of light that has been received in the past.

In a case in which an intensity of a signal is weak or a number of accumulation is difficult to increase, the SPADs 10a to 10n may be grouped into a plurality of groups, and the on states and the off states of the groups may be collectively controlled. This improves the signal-to-noise (S/N) ratio although the spatial resolution of the photodetector 100 is deteriorated.

Figure 7:
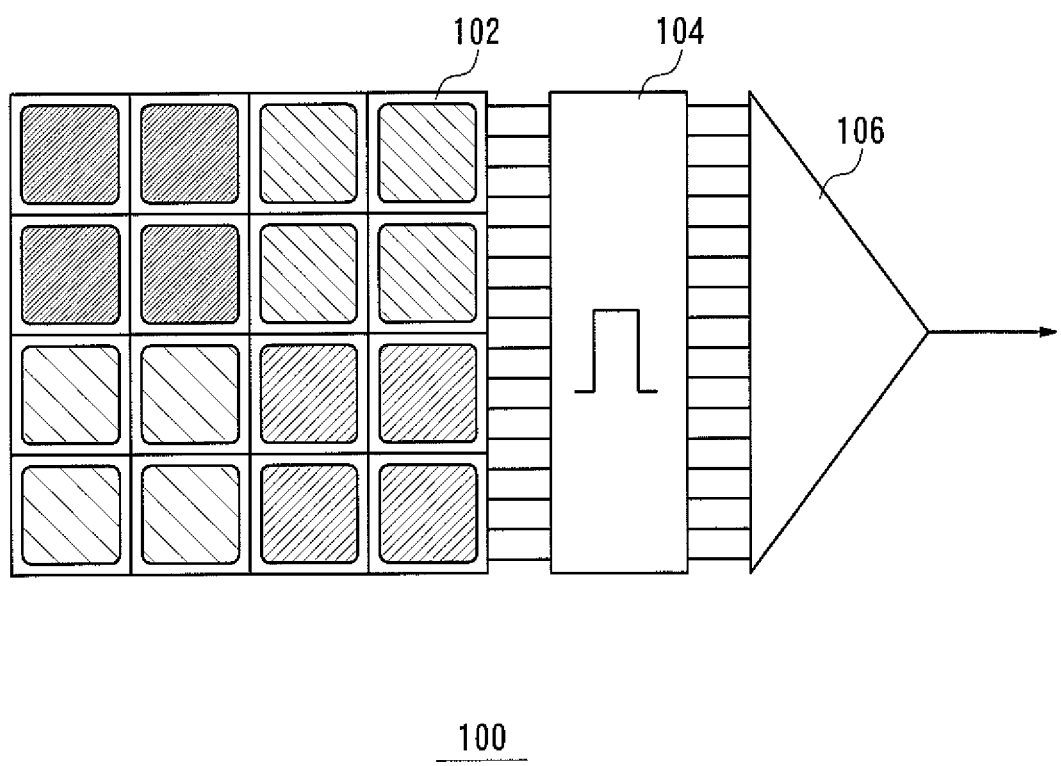
FIG. 7 shows a structure for controlling a plurality of pixels by collecting them into groups in the first embodiment.

For example, as shown in FIG. 7, four adjacent elements may be grouped together, and the on state and the off state may be controlled for each of the groups. FIG. 7 shows elements in the same group by the same type of hatching. In this case, the spatial resolution is decreased to one-fourth of that when the grouping is not performed, but the signal-to-noise (S/N) ratio is improved to twice that when the grouping is not performed.

The structure of the photodetector 100 is not limited to the structure shown in FIG. 1. For example, a structure disclosed in, for example, JP 2012-060012 A, may be employed.

Modification Example 1

Figure 8:
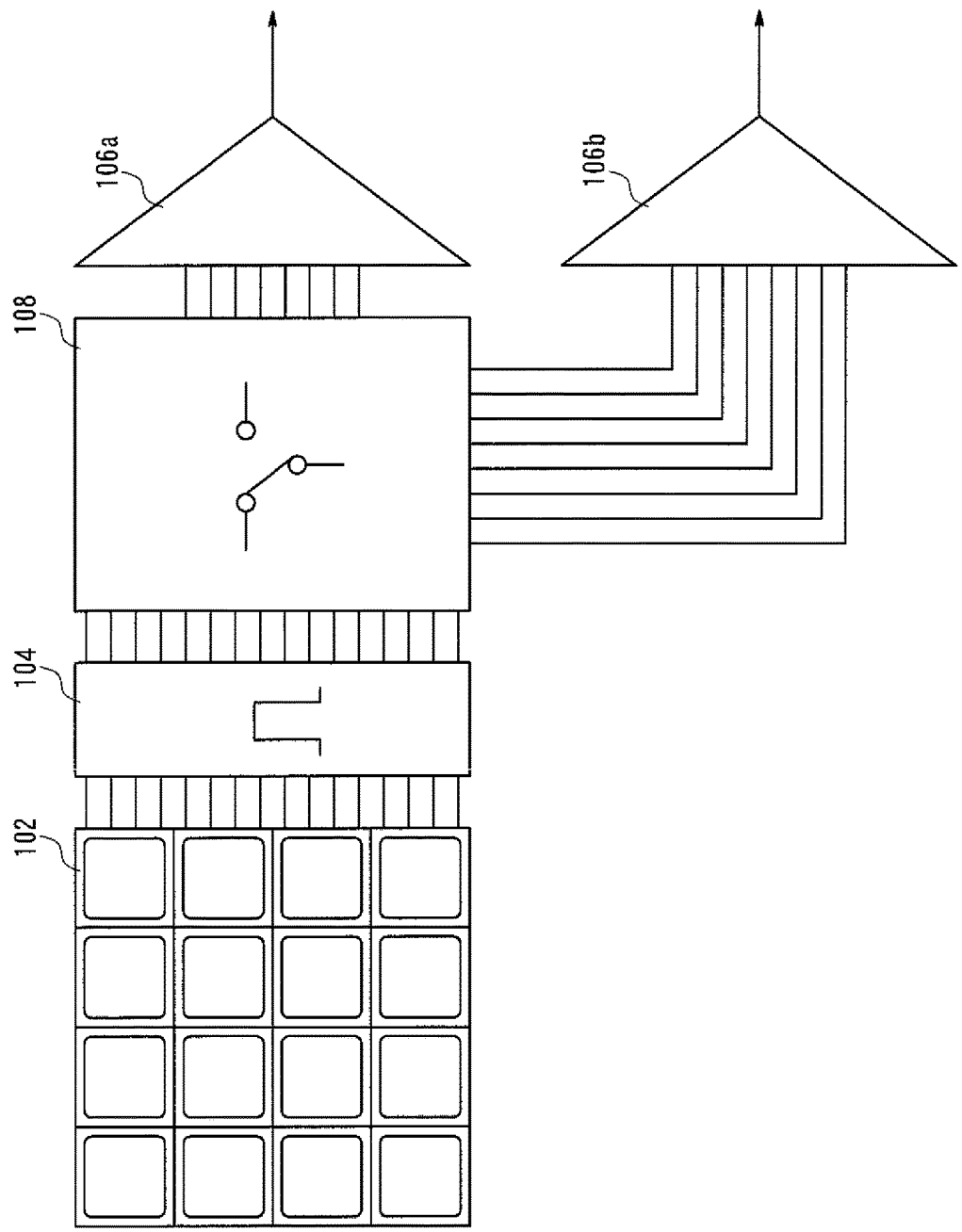
FIG. 8 shows a structure of a photodetector in a modification example 1.

FIG. 8 shows a structure of a photodetector 200 in a modification example 1. The photodetector 200 includes a distributor 108 in addition to the light receiving part 102, the discriminating part 104, and the signal processing part 106. In this modification example, the signal processing part 106 is constituted of signal processing parts 106a and 106b.

The distributor 108 is provided between the discriminating part 104 and the signal processing part 106, more exactly, the signal processing parts 106a and 106b. The distributor 108 exclusively distributes the output signals from the discriminating part 104 and outputs the distributed signals to each of the signal processing parts 106a and 106b. That is, the distributor 108 selects some of the signals of the SPADs 10a to 10n output from the discriminating part 104 and inputs the selected signals in the signal processing part 106a, and the distributor 108 also selects the remaining signals and outputs the selected signals into the signal processing part 106b.

Figure 9:
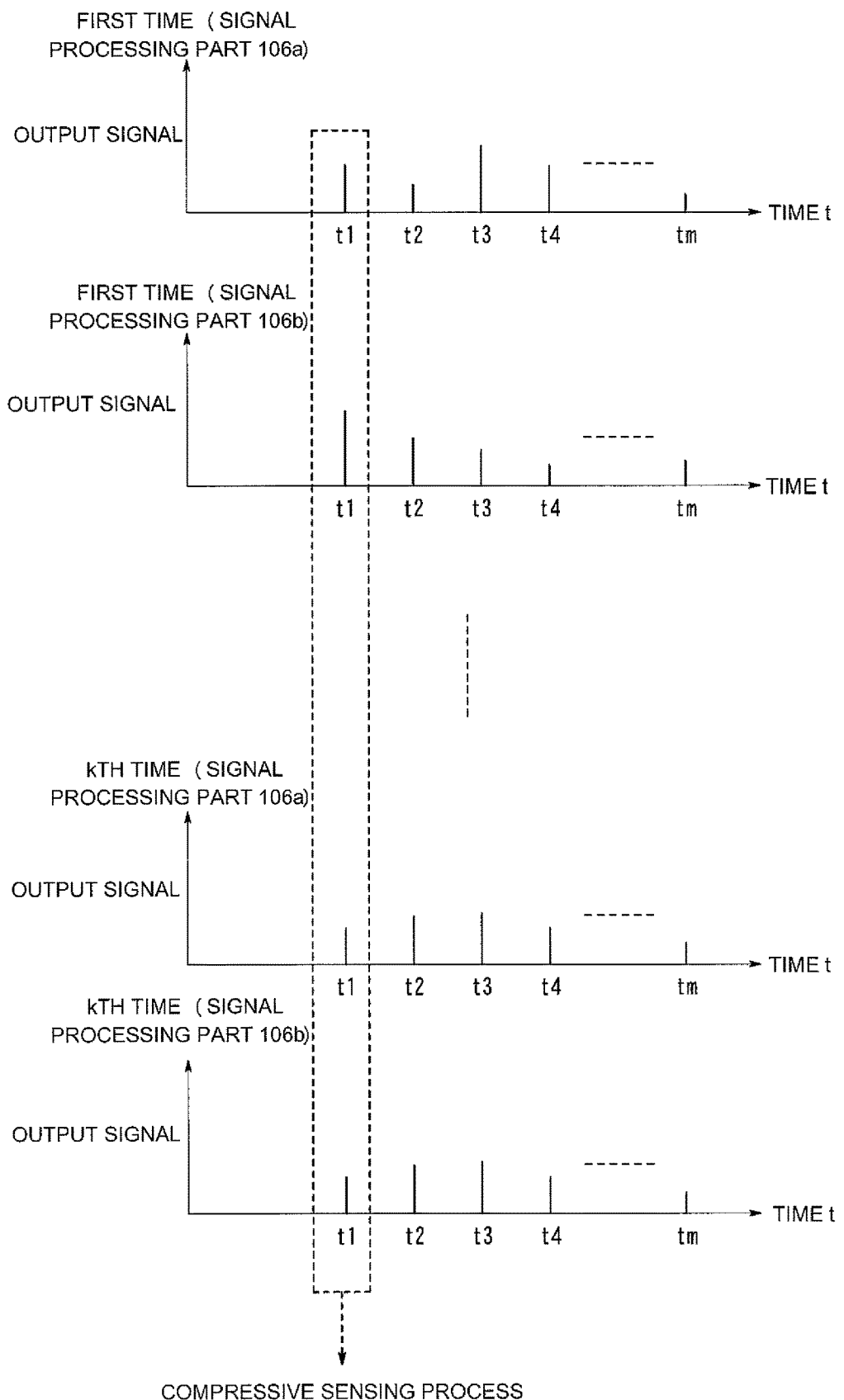
FIG. 9 shows examples of results of measurements in the modification example 1.

In the modification example 1, a plurality of measurements are performed while the distributor 108 switches between the SPADs 10a to 10n to distribute the output to the signal processing parts 106a and 106b. The output signals from each of the signal processing parts 106a and 106b are used to calculate the output of each of the elements. For example, pulsed light is emitted to a target space, and one measurement is performed in the condition in which the outputs from 50% of the elements of the SPADs 10a to 10n are input to the signal processing part 106a, whereas the outputs from the remaining 50% of the elements are input to the signal processing part 106b at times t1, t2, . . . , and tm, after a predetermined time has passed from time t0 when the pulsed light is emitted. Thereafter, a next measurement is performed by randomly switching the distributor 108 so as to not change the ratio of the numbers of the signals input to the signal processing parts 106a and 106b. The measurement is thus repeated, whereby results of the measurements as shown in FIG. 9 are obtained.

Signals are output at the same measurement times which are each an elapsed time after the pulsed light is emitted, and these signals are subjected to compressive sensing to determine which of the elements of the SPADs 10a to 10n reacts. This structure improves the spatial resolution of the photodetector 100 without making the SPADs be in the off state. Thus, the spatial resolution is increased without generating loss time in the measurements and without reducing the overall signal-to-noise (S/N) ratio.

In this modification example 1, the two signal processing parts 106a and 106b are used as the signal processing part 106, and the output signals from the SPADs 10a to 10n are distributed into two by the distributor 108. However, the number of the signal processing parts is not limited to two. That is, three or a greater number of the signal processing parts may be provided as the signal processing part 106, and the output signals from the SPADs 10a to 10n may be distributed and output to the respective signal processing parts.

The numbers of the signals to be input to the signal processing parts 106a and 106b may not be equal to each other, but may be different from each other. For example, the distributor 108 may be controlled so that 60% of the signals will be input to the signal processing part 106a whereas 40% of the signals will be input to the signal processing part 106b. The signal-to-noise ratio is improved by processing using the output signals from the signal processing part 106a to which a greater number of the signals are input. On the other hand, the effect of background light is decreased by processing using the output signals from the signal processing part 106b to which a smaller number of the signals are input.

Figure 10:
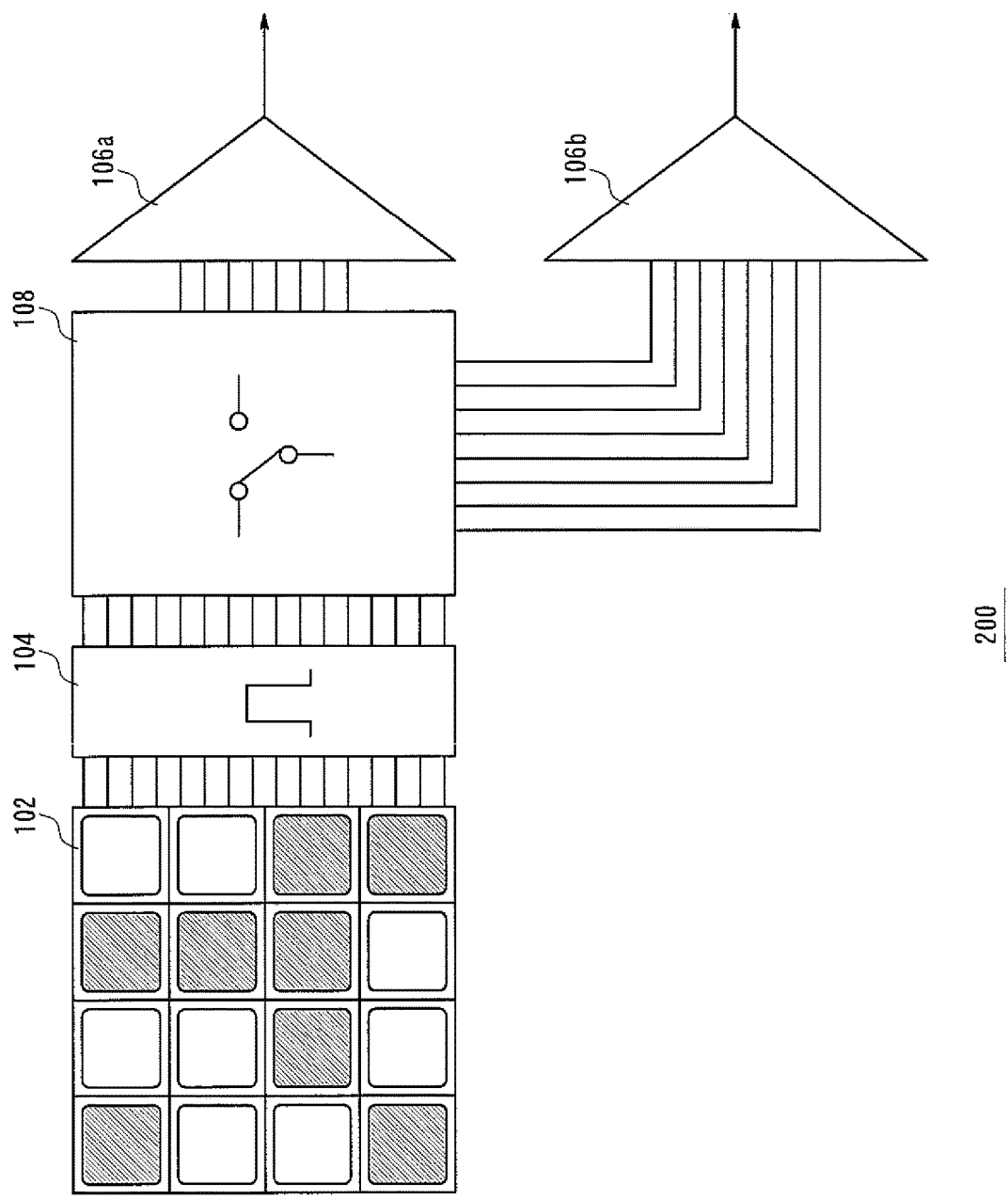
FIG. 10 shows a structure for controlling on states and off states in the modification example 1.

As shown in FIG. 10, in this modification example, some of the SPADs 10a to 10n may be set to be in the on state, whereas the rest may be set to be in the off state. In FIG. 10, a SPAD with hatching is in the on state, whereas a SPAD with no hatching is in the off state. In this case, some of the output signals of the SPADs that are in the on state among the SPADs 10a to 10n may be input to the signal processing part 106a, and the rest of the output signals may be input to the signal processing part 106b.

For example, as in the case of the embodiment, the ratio may be controlled depending on change in the background light. That is, the ratio of the SPADs that are set to be in the on state may be decreased when the intensity of the background light is increased, whereas the ratio of the SPADs that are set to be in the on state may be increased when the intensity of the background light is decreased.

Modification Example 2

When each of the SPADs 10a to 10n of the SiPM 10 with the MP structure reacts to a photon, a specific period during which each of the SPADs 10a to 10n is unable to react to a photon again; that is, a dead time, occurs after each of the SPADs 10a to 10n reacts. In view of this, in this modification example, the on states and the off states of the SPADs 10a to 10n constituting the SiPM 10 are periodically switched to make the dead times of the SPADs 10a to 10n occur at different timings, thereby suppressing the effect of the dead times of the whole photodetector 100.

Figure 11:
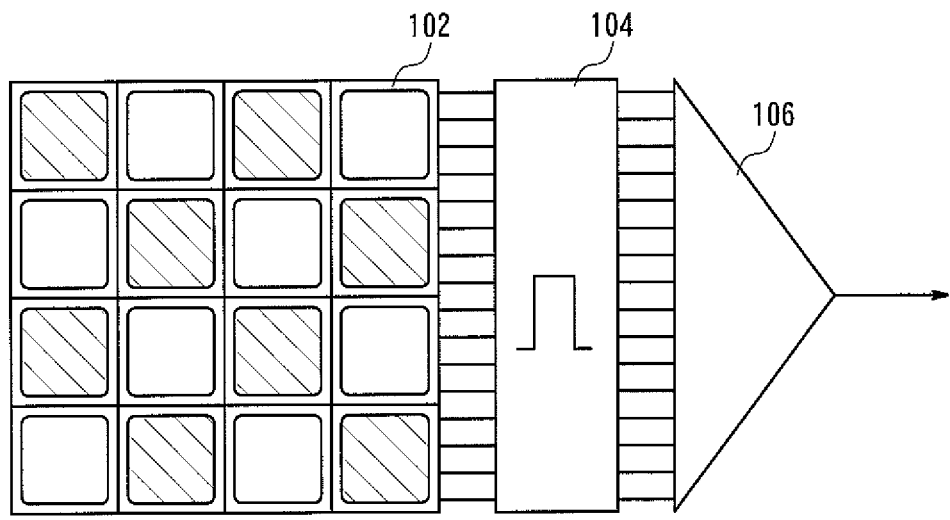
FIG. 11 shows a structure of a photodetector in a modification example 2.
Figure 11:
Figure 11:
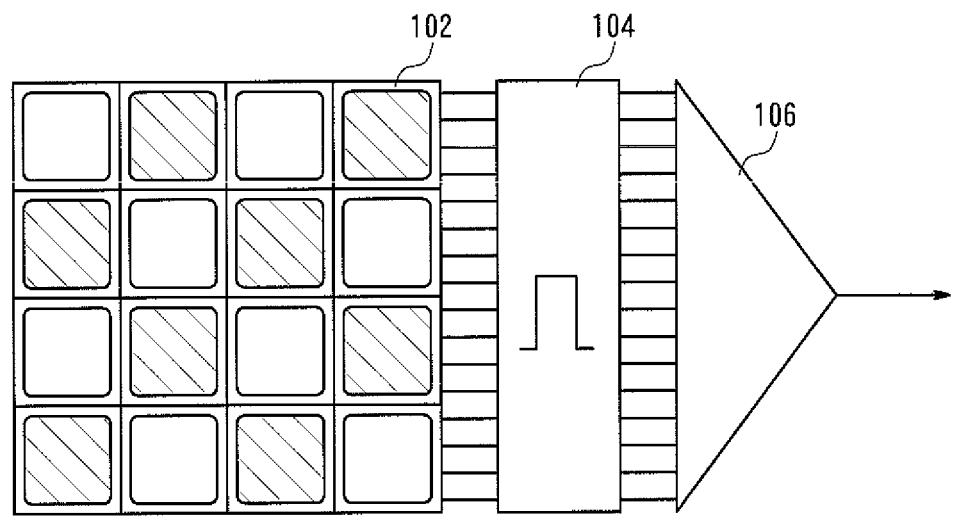

For example, as shown in FIG. 11, a first pattern and a second pattern are switched. In FIG. 11, a SPAD with hatching is in the on state, whereas a SPAD with no hatching is in the off state. That is, the SPADs 10a to 10n are controlled so that adjacent elements will be in the on state and the off state in an alternate manner.

Figure 12:
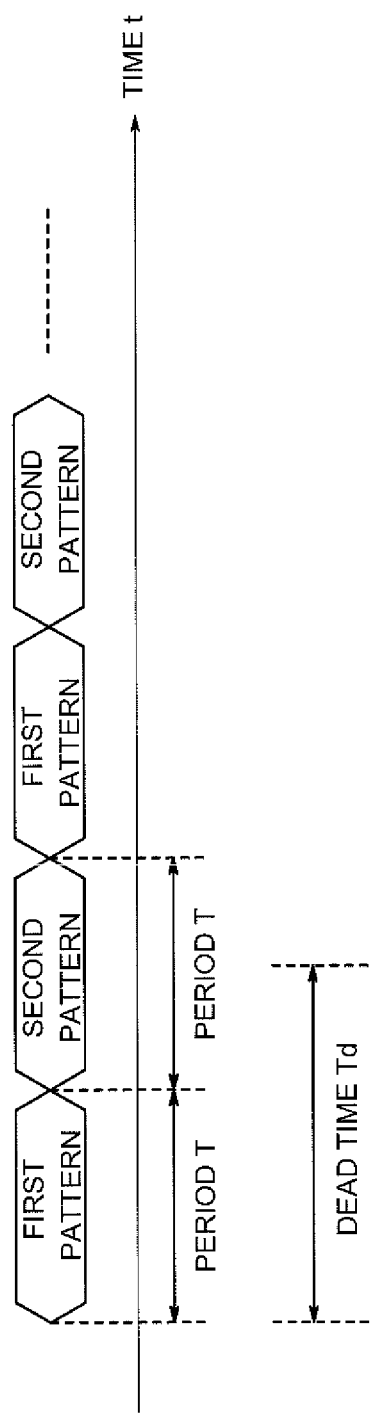
FIG. 12 shows a method for controlling the photodetector in the modification example 2.

At this time, as shown in FIG. 12, the on states and the off states of the SPADs 10a to 10n may be controlled so that a period T for switching the first state and the second state and a dead time Td satisfy a relationship: $T<Td<2T$.

This control enables measurement using the photodetector 100 while avoiding the effect of the dead times.

Although the two patterns of the states of the SPADs 10a to 10n are set and are switched in this modification example, three or a greater number of the patterns of the states may be set and be switched. In this case, the on states and the off states may be controlled so that a period T for switching n number of patterns of the states and the dead time Td will satisfy a relationship: $T<Td<nT$. That is, assuming that the time when an element among the SPADs 10a to 10n is turned to the on state is represented as time t1, the time when this element is returned to the off state is represented as time t2, and the time when this element is turned to the on state again is represented as time t3, the element may be controlled so that a period (t2−t1) will be shorter than the dead time Td, and a period (t3−t1) will be longer than the dead time Td.

In a case in which crosstalk occurs within the SiPM 10, the pattern may be set so that a distance between elements in the on state will be greater than a distance over which the crosstalk occurs.

Figure 13:
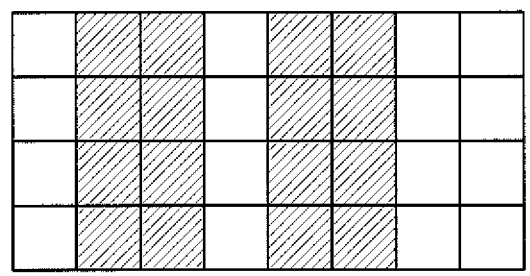
FIG. 13 shows control patterns of the photodetector in the modification example 2.
Figure 13:
Figure 13:
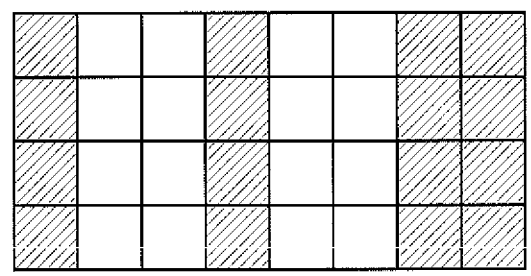

For example, in a case in which crosstalk occurs to a distance of only two elements in the array of the SiPM 10 as shown in FIG. 13, a pattern A, in which a distance between elements in the on state is made greater than a distance in which the crosstalk occurs, and a pattern B, may be switched. In FIG. 13, a SPAD with hatching is in the off state, whereas a SPAD with no hatching is in the on state. The switching time is set shorter than the dead time.

Figure 14:
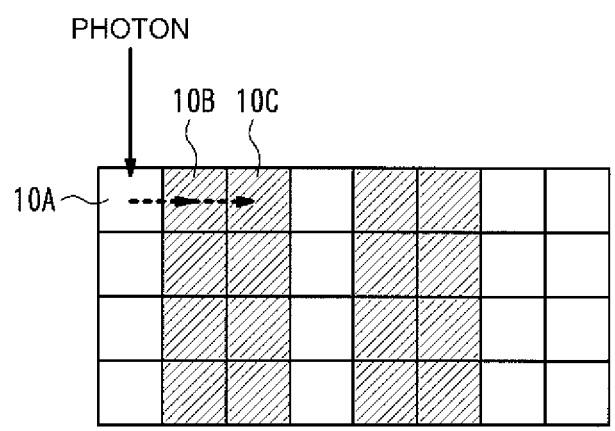
FIG. 14 shows an effect for reducing an influence of crosstalk in the modification example 2.

As shown in FIG. 14, when a photon enters a SPAD 10A in the pattern A, SPADs 10B and 10C that can be affected by crosstalk are in the off state and thereby the elements do not react to the photon due to the crosstalk. Thus, occurrence of the dead times of the SPADs 10B and 10C is prevented when the pattern A is switched to the pattern B. That is, the effect of the crosstalk is decreased.

The structure of this modification example may be combined with the structure of the embodiment or the modification example 1. For example, measurements may be performed in the condition in which an element to be in the on state is randomly selected from among the SPADs 10a to 10n that satisfy the above-described condition for avoiding the effect of the dead time. In this case, the spatial resolution is improved by using a compressive sensing process while the effect of the dead time is avoided.

The invention claimed is:

1. A photodetector comprising:
   an array including a plurality of light receiving elements;
   a plurality of quenching elements, each light receiving element of the plurality of light receiving elements being connected to a corresponding quenching element of the plurality of quenching elements; and
   an adding circuit that adds outputs from the light receiving elements and outputs a result,
   the photodetector being configured
      to cause the adding circuit to output a plurality of measurement results for a same target space while randomly switching on and off states of the quenching elements to randomly switch on and off states of the corresponding light receiving elements among the light receiving elements in the array, and
      to subject the plurality of measurement results to a compressive sensing process to determine an output signal for each light receiving element or for each group of light receiving elements.

2. The photodetector according to claim 1, wherein
   the light receiving elements comprise avalanche photodiodes to be used in a Geiger mode,
   the photodetector further comprises a plurality of discriminating circuits that convert output signals from the avalanche photodiodes into rectangular pulses, and
   the adding circuit is configured to add the rectangular pulses generated by the plurality of discriminating circuits and to output the result.

3. The photodetector according to claim 1, which is configured to subject an output from the adding circuit to a threshold process.

4. The photodetector according to claim 2, which is configured to subject an output from the adding circuit to a threshold process.

5. The photodetector according to claim 1, which is configured to subject, to the compressive sensing process, output signals obtained from the light receiving elements while on and off states of the light receiving elements in the array are switched on a time basis.

6. The photodetector according to claim 1, which is configured to set a ratio between a number of on-state light receiving elements and a number of off-state light receiving elements in accordance with a number of measurements.

7. The photodetector according to claim 1, which is configured to allow the compressive sensing process to determine a faulty element among the light receiving elements.

8. The photodetector according to claim 1, which is configured to set a ratio of between a number of on-state light receiving elements and a number of off-state light receiving elements in accordance with background light intensity.

9. An optical distance measuring device comprising the photodetector according to claim 1 and being configured to perform distance measurement by measuring a time taken for applied light to trawl.

10. The photodetector according to claim 1, wherein
    the combination of effective light receiving elements is randomly changed at a predetermined switching time interval that is set to be shorter than a dead time of a light receiving element, the dead time being a period during which the light receiving element is unable to react to a photon again after having reacted to a photon.

11. The photodetector according to claim 1, wherein
    the adding circuit is constituted of a plurality of current sources corresponding to the plurality of light receiving elements in the array, each current source being configured to supply current of a predetermined value.

* * * * *